(12) United States Patent
Luo et al.

(10) Patent No.: US 10,784,229 B2
(45) Date of Patent: Sep. 22, 2020

(54) WAFER LEVEL PACKAGE STRUCTURE AND WAFER LEVEL PACKAGING METHOD

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/229,850

(22) Filed: Dec. 21, 2018

(65) Prior Publication Data

US 2020/0075539 A1 Mar. 5, 2020

Related U.S. Application Data

(63) Continuation of application No. PCT/CN2018/113101, filed on Oct. 31, 2018.

(30) Foreign Application Priority Data

Oct. 31, 2018 (CN) .......................... 2018 1 1026706

(51) Int. Cl.
*H01L 23/52* (2006.01)
*H01L 23/00* (2006.01)
(Continued)

(52) U.S. Cl.
CPC ............ *H01L 24/94* (2013.01); *H01L 21/561* (2013.01); *H01L 21/565* (2013.01);
(Continued)

(58) Field of Classification Search
CPC ... H01L 21/565; H01L 21/568; H01L 21/561; H01L 23/3121; H01L 24/08; H01L 24/80; H01L 24/94; H01L 25/50; H01L 25/0652
(Continued)

(56) References Cited

U.S. PATENT DOCUMENTS 8,802,495 B2 * 8/2014 Kim .................. H01L 24/96
438/107
8,802,541 B2 * 8/2014 Wang ................ H01L 21/76251
438/459
(Continued)

FOREIGN PATENT DOCUMENTS

CN 102072967 A 5/2011
CN 105140143 A 12/2015
CN 108346639 A 7/2018

*Primary Examiner* — Luan C Thai
(74) *Attorney, Agent, or Firm* — Anova Law Group, PLLC

(57) ABSTRACT

Wafer level package structures and packaging methods are provided. An exemplary method includes providing a device wafer having a first front surface and a first back surface opposing the first front surface, wherein at least one first chip is integrated in the first front surface; forming a first oxide layer on the first front surface of the device wafer; providing at least one second chip having a to-be-bonded surface; forming a second oxide layer on the to-be-bonded surface of each second chip; providing a carrier wafer; temporally bonding a surface of the second chip opposing the second oxide layer to the carrier wafer; forming an encapsulation layer on the carrier wafer between adjacent second chips of the at least one second; and bonding the device wafer and the second chip by bonding the first oxide layer with the second oxide layer by a low-temperature fusion bonding process.

20 Claims, 4 Drawing Sheets

(51) Int. Cl.
*H01L 21/56* (2006.01)
*H01L 23/31* (2006.01)
*H01L 25/065* (2006.01)
*H01L 25/00* (2006.01)

(52) U.S. Cl.
CPC ........ *H01L 21/568* (2013.01); *H01L 23/3121* (2013.01); *H01L 24/08* (2013.01); *H01L 24/80* (2013.01); *H01L 25/0652* (2013.01); *H01L 25/50* (2013.01); H01L 2224/08145 (2013.01); H01L 2224/80013 (2013.01); H01L 2224/80896 (2013.01); H01L 2225/06524 (2013.01); H01L 2225/06582 (2013.01); H01L 2924/0534 (2013.01); H01L 2924/0545 (2013.01); H01L 2924/05432 (2013.01); H01L 2924/05442 (2013.01)

(58) Field of Classification Search
USPC .......................................... 257/777; 438/106
See application file for complete search history.

(56) References Cited

U.S. PATENT DOCUMENTS

| | | | |
|---|---|---|---|
| 9,570,429 B2 * | 2/2017 | Mao | H01L 25/0657 |
| 9,653,372 B2 * | 5/2017 | Kwon | H01L 21/4853 |
| 10,418,353 B2 * | 9/2019 | Lee | H01L 24/95 |
| 2013/0207098 A1 | 8/2013 | Yeh et al. | |

\* cited by examiner

WAFER LEVEL PACKAGE STRUCTURE AND WAFER LEVEL PACKAGING METHOD

CROSS-REFERENCES TO RELATED APPLICATIONS

This application is a continuation application of PCT patent application No. PCT/CN2018/113101, filed on Oct. 31, 2018, which claims priority to Chinese patent application No. 201811026706.X, filed on Sep. 4, 2018, the entirety of all of which is incorporated herein by reference.

FIELD OF THE DISCLOSURE

The present disclosure generally relates to the field of semiconductor manufacturing technology and, more particularly, relates to wafer level package structures and wafer level packaging methods.

BACKGROUND

With the continuous development of ultra-large scale integrated circuits, the critical dimension of integrated circuits has been continuously reduced, and the requirements for the packaging technologies of integrated circuits are correspondingly increased. The existing packaging technologies include ball grid array (BGA) package, chip scale package (CSP), wafer level package (WLP), three-dimensional (3D) package and system in package (SiP), etc.

Currently, to meet the goals of integrated circuit packaging, such as lower cost, more reliable, faster and higher density, advanced packaging methods mainly use the wafer-level system-in-package (WLSiP). Comparing with the conventional packaging methods, the wafer-level system-in-package includes an integrated packaging process on a wafer, which significantly reduces the area of the package structure, reduces manufacturing costs, optimizes electrical performance, and realizes batch manufacturing, etc., and can significantly reduce workload and equipment demands.

The wafer-level system-in-package mainly includes two important processes including a physical bonding and an electrical connection. Usually, an organic bonding layer (for example, an adhesive film) is used to realize a physical bonding between the device wafer and the to-be-integrated chip; and the electrical connections among the semiconductor devices are realized by a via etching process (such as a through-silicon via etching process) and an electroplating process.

BRIEF SUMMARY OF THE DISCLOSURE

One aspect of the present disclosure provides a wafer level packaging method. The wafer level packaging method includes providing a device wafer having a first front surface and a first back surface opposing the first front surface, wherein at least one first chip is integrated on the first front surface of the device wafer; forming a first oxide layer on the first front surface of the device wafer; providing at least one second chip having a to-be-bonded surface; forming a second oxide layer on the to-be-bonded surface of each second chip; providing a carrier wafer; temporally bonding a surface of the second chip opposing the second oxide layer to the carrier wafer; forming an encapsulation layer on the carrier wafer between adjacent second chips of the at least one second chip, the encapsulation exposing a top of the second oxide layer; and bonding the device wafer and the second chip by bonding the first oxide layer and the second oxide layer by a low-temperature fusion bonding process.

Another aspect of the present disclosure also provides a wafer level package structure. The wafer level package structure includes a device wafer having a first front surface and a first back surface opposing the first front surface, wherein at least a first chip is integrated in the first front surface and a first oxide layer is formed on the first front surface; a second chip bonded with the device wafer, wherein the second chip has a to-be-bonded surface, a second oxide layer is formed on the to-be-bonded surface, and the second oxide layer and the first oxide layer are bonded by a low-temperature fusion bonding process; and an encapsulation layer formed on the first oxide layer and exposing a surface of the second chip opposing the to-be-bonded surface.

Other aspects of the present disclosure can be understood by those skilled in the art in light of the description, the claims, and the drawings of the present disclosure.

DETAILED DESCRIPTION

The current wafer-level packaging process has a low packaging yield. The device wafer and the to-be-integrated chip are usually physically bonded by an adhesive layer (for example, an adhesive film or a dry film). However, the temperature resistance of the adhesive layer is poor. When the process temperature in the subsequent process is high, the adhesive layer is easily broken, thus the adhesion of the adhesive layer is reduced, and the device wafer and the be-integrated-chip are even detached. Thus, the packaging yield of the wafer-level system-in-package is severely affected.

The present disclosure provides a wafer level packaging method and a wafer level package structure to improve the packaging yield.

An exemplary wafer level packaging method may include providing a device wafer integrated with a first chip. The device wafer may have a first front surface integrated with the first chip and a first back surface opposing the first front surface. The method may also include forming a first oxide layer on the first front surface. Further, the method may include providing a to-be-integrated second chip. The second chip may have a to-be-bonded surface. Further, the method may include forming a second oxide layer on the to-be-bonded surface; providing a carrier substrate; temporarily bonding the surface of the second chip facing back to the second oxide layer to the carrier substrate; and forming an encapsulation layer on the carrier substrate. The encapsulation layer may expose a top of the second oxide layer. Further, the method may include bonding the device wafer with the second chip by a low-temperature fusion bonding process through the first oxide layer and the second oxide layer.

In the present disclosure, the second chip may be effectively supported by the encapsulation layer during the low-temperature fusion bonding process, and the operability of the low-temperature fusion bonding process may be improved. On the other hand, through the low-temperature fusion bonding process, the contact surfaces of the first oxide layer and the second oxide layer may form covalent bonds, and the first oxide layer and the second oxide layer may be bonded in a covalent bond manner, and the bonding strength may be substantially high. Thus, the bonding strength between the device wafer and the second chip may be significantly increased; and the packaging yield may be accordingly increased.

To allow the above described objectives, features and advantages to be more apparent, the specific embodiments of the present disclosure will be described in detail below with reference to the accompanying drawings.

FIGS. 1-10 illustrates structures corresponding to certain stages during an exemplary wafer level packaging method according to the present disclosure.

Figure 1:
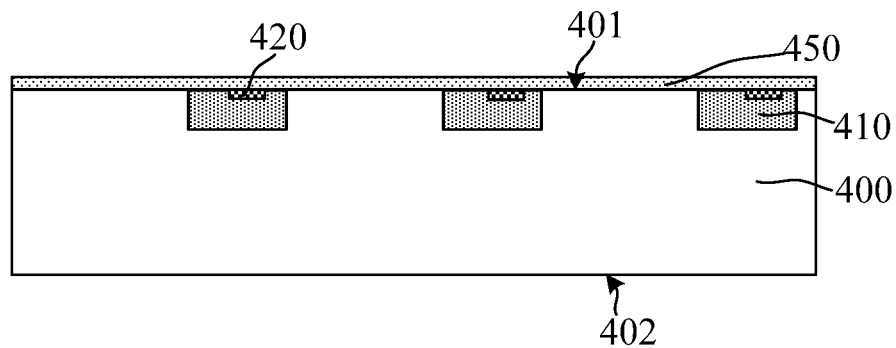
FIGS. 1-10 illustrate structures corresponding to certain steps of during an exemplary wafer level packaging method consistent with various disclosed embodiments.

As shown in FIG. 1, a device wafer (e.g., a CMOS wafer) 400 integrated with at least a first chip 410 is provided. The device wafer 400 may include a first front surface 401 integrated with the first chip 410 and a first back surface 402 opposing the first front surface 401.

In one embodiment, the wafer level packaging method may be used to implement a wafer-level system-in-package. The device wafer 400 may be bonded with a to-be-integrated chip in subsequent processes.

The device wafer 400 may be a wafer fabricated with a device (s). The device wafer 400 may be fabricated by an integrated circuit fabrication process. For example, NMOS devices and/or PMOS devices may be formed on a semiconductor substrate by deposition processes and etching processes, etc. Dielectric layers, interconnect structures and soldering pads electrically connected with the interconnect structures, etc., may be formed on the devices such that the device wafer 400 may be integrated with at least one first chip 410; and at least one first soldering pad (Pad) 420 may be formed in the first chip 410.

It should be noted that, when the number of the first chip 410 is more than one, the plurality of first chips 410 may be the same type or different types.

It also should be noted that, for illustrative purposes, in one embodiment, that three first chips 410 are integrated in the device wafer 400 is used as an example for the description. However, the number of the first chips 410 is not limited to three.

In one embodiment, the semiconductor substrate of the device wafer 400 is a silicon substrate. In some embodiments, the material of the semiconductor substrate may also be other materials, such as germanium, silicon germanium, silicon carbide, gallium arsenide or indium gallium, etc. The semiconductor substrate may also be other types of substrates, such as a silicon on insulator (SOI) substrate, or a germanium on insulator (GOI) substrate, etc. The material of the semiconductor substrate may be a material suitable for process needs or easy to integrate.

In one embodiment, the device wafer 400 may include a first front surface 401 integrated with the first chip 410 and a first back surface 402 opposing the first front surface 401. The first front surface 401 may expose the first soldering pad 420. The first soldering pad 420 may be a bonding pad of the device wafer 400, and the first soldering pad 420 may be used to form an electrical connection between the first chip 410 and other circuit. The first back surface 402 may refer to as a bottom surface of the semiconductor substrate of the device wafer 400 away from the side of the semiconductor substrate having the first soldering pad 420.

In one embodiment, according to actual process requirements, the thickness of the device wafer 400 may be in range of approximately of 10 μm to 100 μm.

Further, as shown in FIG. 1, a first oxide layer 450 may be formed on the first front surface 401.

The first oxide layer 450 may be used as a bonding layer for a subsequent fusion bonding process for achieving a physical connection between the device wafer 400 and a to-be-integrated chip. After the subsequent fusion bonding process, the bonding layers between the device wafer 400 and the to-be-integrated chip may be bonded in a covalent bond manner. Thus, the bonding strength between the device wafer 400 with the to-be-integrated device may be increased.

In one embodiment, the material of the first oxide layer 450 is silicon oxide. By selecting silicon oxide, in the subsequent fusion bonding process, the device wafer 400 and the to-be-integrated chip may be bonded by covalent bonds of Si—O—Si. Because the bonding energy of the silicon-oxygen bond may be substantially large, it may facilitate to further improve the bonding strength between the device wafer 400 and the to-be-integrated chip. Moreover, silicon oxide may have a substantially high process compatibility, and silicon oxide is also a commonly used low cost material. Thus, by selecting silicon oxide, the process difficulty and the process cost may be reduced, and the impacts on the performance of the formed package structure may be reduced. In some embodiments, the first oxide layer may also be hafnium oxide, aluminum oxide, or lanthanum oxide, etc.

In particular, the first oxide layer 450 may be formed by an atomic layer deposition (ALD) process. The atomic layer deposition process refers to a deposition process in which a gas phase precursor is alternately introduced into a reaction chamber and chemically adsorbed on a substrate to have a surface reaction. The first oxide layer 450 may be formed on the first front surface 401 in the form of atomic layers by the atomic layer deposition process. Thus, the uniformity in the deposition rate may be increased, the uniformity in the thickness of the first oxide layer 450, and the uniformity in the structure of the first oxide layer 450 may be improved, and the first oxide layer 450 may has a desired surface coverage ability. Further, the process temperature of the atomic layer deposition process may be relatively low. Thus, the thermal budget may be reduced, and the probability of the wafer distortion and the device performance offset may be reduced.

In another embodiment, according to the material of the first oxide layer, the process for forming the first oxide layer may also be a low-pressure chemical vapor deposition (LPCVD) process or a metal-organic chemical vapor deposition (MOCVD) process, a physical vapor deposition (PVD) process or a pulsed laser deposition (PLD) process, etc.

Figure 2:
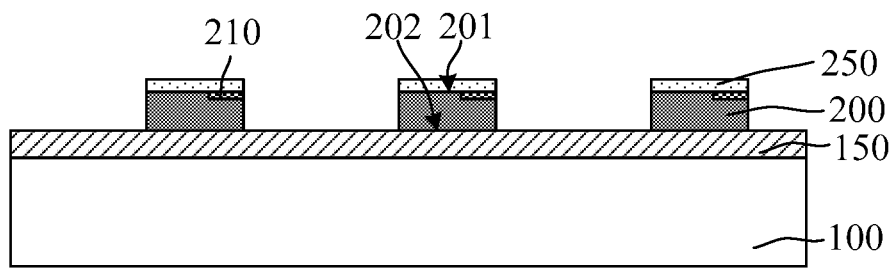

Further, as shown in FIG. 2, at least one to-be-integrated second chip 200 may be provided. The second chip 200 may have a to-be-bonded surface (not labeled).

The second chip 200 may be used as a to-be integrated chip in a wafer-level system-in-package. The number of the second chips 200 may be at least one, and the number of the second chips 200 may be the same as the number of the first chips 410 (as shown in FIG. 1).

The second chip 200 may be one or more of an active device, a passive device, a microelectromechanical system (MEMS), and an optical device, etc. In particular, the second chip 200 may be a memory chip, a communication chip, a processing chip, a flash memory chip, or a logic chip, etc. In some embodiments, the second chip may also be other functional chips.

In one embodiment, the wafer-level system-in-package is used to integrate a plurality of second chips 200 of different functions into one package structure. Thus, the plurality of second chips 200 may be obtained by dicing a plurality of wafers of different function types. In some embodiment, the function types of the plurality of second chips may be the same according to actual process requirements.

By integrating the plurality of second chips 200 into the device wafer 400 (as shown in FIG. 1) and completing an integrated packaging process on the device wafer 400, the area of the package structure may be significantly reduced. Further, the manufacturing cost may be reduced, the electrical performance may be optimized, and the batch manufacturing may be achieved. Accordingly, the workload and equipment requirements may be significantly reduced.

It should be noted that, the wafer level packaging method of the present disclosure may be used to implement heterogeneous integration, and thus the plurality of second chips 200 may be chips made of silicon wafers. In some embodiments, the second chips may also be chips made of other materials.

It should be noted that, for illustrative purposes, in one embodiment, that the number of the second chips 200 is three is used as an example. However, the number of the second chips 200 is not limited to three.

The second chips 200 may be fabricated by an integrated circuit fabrication process. The second chips 200 may also often include devices, such as NMOS devices and/or PMOS devices, formed on a semiconductor substrate, and further include dielectric layers, metal interconnect structures, and/or soldering pads, etc.

In one embodiment, a second chip 200 may include a second front surface 201 formed with a second soldering pad 210 and a second back surface 202 opposing the second front surface 201. The second front surface 201 may expose the second soldering pad 210. The second soldering pad 210 may be used as a lead pad used to form an electrical connection between the second chip 200 and other circuits. The second back surface 202 may refer to as a bottom surface of the semiconductor substrate on the side of the second chip 200 away from the second soldering pad 210.

In one embodiment, the to-be-bonded surface of the second chip 200 may be the second front surface 201. In particular, the second front surface 201 may be subsequently directed toward the device wafer 400. By using such a configuration, during subsequently forming a via structure passing through the device wafer 400 and electrically connected to the second chip 200 (for example, a through-silicon via structure), the thickness of the via structure may be decreased, the process difficulty for forming the via structure may be reduced, and the process cost may be reduced. In some embodiments, the to-be-bonded surface may also be the second back surface according to actual process requirements. In particular, the second back surface may be subsequently directed toward the device wafer.

Further, as show in FIG. 2, a second oxide layer 250 may be formed on the to-be-bonded surface (not labeled).

The second oxide layer 250 may serve as a bonding layer of a subsequent fusion bonding process to realize a physical connection between the device wafer 400 (as shown in FIG. 1) and the second chip 200. Accordingly, the bonding strength between the second chip 200 and the device wafer 400 may be significantly increased through the manner of covalent bonds.

Moreover, when subsequently forming a via structure passing through the device wafer 400 and electrically connected to the second chip 200, the process for forming the via structure may often include a via etching process (for example, a through-silicon via etching process), and the via etching process may sequentially etch the device wafer 400 and the second oxide layer 250. Because the second oxide layer 250 may be made of an inorganic material and the device wafer 400 may also be made of an inorganic material, comparing with the approach using an organic adhesive layer (for example, an adhesive film) as a bonding layer, using the second oxide layer 250 as a bonding layer may facilitate to reduce the process difficulty of the subsequent via etching process. Further, after the via etching process, the problem that the diameter of the via in the second oxide layer 250 is subsequently large may be avoided. Thus, the electrical connection performance of the via structure may be improved.

In one embodiment, the material of the second oxide layer 250 may be the same as the material of the first oxide layer 450 such that the covalent bonding may be better formed in the subsequent fusion bonding process. Accordingly, the bonding strength between the second oxide layer 250 and the first oxide layer 450 may be further increased. In one embodiment, the second oxide layer 250 may be formed by an atomic layer deposition process, and the material of the second oxide layer 250 may be silicon oxide.

In some embodiments, the second oxide layer may also be hafnium oxide, aluminum oxide, or lanthanum oxide, etc. According to the material of the second oxide layer, the process for forming the second oxide layer may also be a low-pressure chemical vapor deposition process, a metal-organic chemical vapor deposition process, a physical vapor deposition process, or a pulsed laser deposition process, etc.

The detailed description of the second oxide layer 250 may refer to the previous description of the first oxide layer 450, and is not described herein again.

In one embodiment, the to-be-bonded surface of the second chip 200 is the second front surface 201. Correspondingly, the second oxide layer 250 may be formed on the second front surface 201. In some embodiments, when the to-be-bonded surface is the second back surface, the second oxide layer may be formed on the second back surface.

It should be noted that, the plurality of second chips 200 may be obtained by dicing one or more wafers. Thus, to improve the yield and the quality of the second oxide layer 250, after forming the second oxide layer 250 on a wafer integrated with the second chips 200, the wafer on which the second oxide layer 250 is formed may be diced; and the second chips 200 on which the second oxide layer 250 is formed may be obtained.

Further, as shown in FIG. 2, a carrier substrate 100 may be provided. The surface of the second chip 200 facing back to the second oxide layer 250 may be temporarily bonded to the carrier substrate 100.

The carrier substrate 100 may be used to support the plurality of second chips 200, and the operability of the subsequent process may be improved. The carrier substrate 100 may also be used to provide a process platform for a subsequent injection molding (Molding) process. Further, by the means of temporary bonding, it may be convenient to subsequently separate the second chips 200 from the carrier substrate 100.

In one embodiment, the carrier substrate 100 is a carrier wafer. In particular, the carrier substrate 100 may be a semiconductor substrate (e.g., a silicon substrate), an organic glass wafer, an inorganic glass wafer, a resin wafer, a semiconductor material wafer, an oxide crystal wafer, a ceramic wafer, a metal crystal wafer, an organic plastic wafer, an inorganic oxide wafer, or a ceramic material wafer, etc.

In one embodiment, the second back surface 202 of the second chip 200 may be bonded on the carrier substrate 100 by an adhesive layer 150. In one embodiment, the adhesive layer 150 is a die attach film (DAF). In some embodiments, the adhesive layer may also be a dry film, a UV glue, or a thermosetting glue, etc.

In some embodiments, when the to-be-bonded surface of the second chip is the second back surface, the second front surface of the second chip may be correspondingly bonded on the carrier substrate by an adhesive layer.

Figure 3:
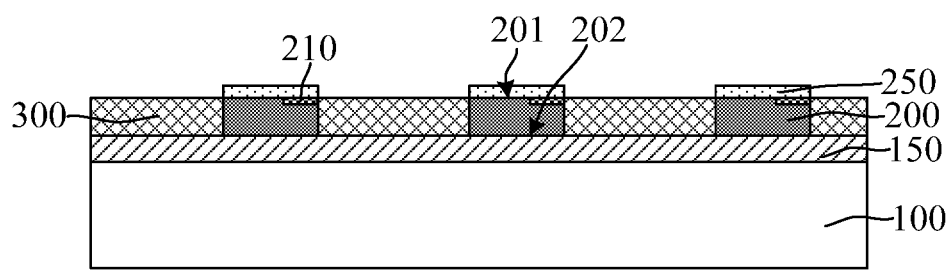

Further, as shown in FIG. 3, an encapsulation layer 300 covering sidewall surfaces of the second chip 200 may be formed on the carrier substrate 100. The encapsulation layer 300 may expose a top portion of the second oxide layer 250.

The encapsulation layer 300 may cover the second chip 200. After bonding the second chip 200 with the device wafer 400 (as shown in FIG. 1), the encapsulation layer 300 may have the functions of sealing and anti-moisture to protect the second chip 200. Thus, the probability that the second chip 200 is damaged, contaminated or oxidized may be reduced. Accordingly, the performance of the obtained package structure may be optimized. Further, the encapsulation layer 300 may cover a plurality of second chips 200, and may be able to support the second chips 200. Thus, the operability of the subsequent fusion bonding process may be improved, and the effects of the subsequent processes to the second chip 200 may be reduced.

In one embodiment, the encapsulation layer 300 may expose the top of the second oxide layer 250, a process foundation of the fusion bonding process of the second oxide layer 250 and the first oxide layer 450 (shown in FIG. 1) may be provided. Moreover, in the step for forming the encapsulation layer 300, the second oxide layer 250 may be formed on the to-be-bonded surface (not labeled) of the second chip 200, the influence of the process for forming the encapsulation layer 300 to the to-be-bonded surface may be avoided. Accordingly, the influence on the bonding strength between the to-be-bonded surface and the second oxide layer 250 may be reduced.

In one embodiment, the material of the encapsulation layer 300 may be epoxy resin (Epoxy). Epoxy resin may have the advantages of low shrinkage, good adhesion, good corrosion resistance, excellent electrical properties and low cost, etc. Thus, it is widely used as a packaging material for electronic devices and integrated circuits. In some embodiments, the material of the encapsulation layer may also be a thermosetting material, such as polyimide, or silicon, etc.

In one embodiment, the encapsulation layer 300 is formed by an injection molding process. A liquid molding compound or a solid molding compound may be used to form the encapsulation layer 300. The encapsulation layer 300 may have a shape of a wafer. The diameter of the encapsulation layer 300 having the shape of a wafer may the same as the diameter of the device wafer 400. In some embodiments, the encapsulation layer may also be in other suitable shapes.

In particular, an injection molding film covering the second chip 200 may be formed on the carrier substrate 100 by a hot press injection molding process. The injection molding film may be then planarized to expose the top of the second oxide layer 250.

In one embodiment, to increase the supporting effect on the second chip 200 in the subsequent process, after forming the encapsulation layer 300, the carrier substrate 100 may be retained such that the carrier substrate 100 and the encapsulation layer 300 may both function as a support of the second chip 200. In some embodiments, after forming the encapsulation layer, the second chip and the carrier substrate may be subjected to a de-bonding process to remove the carrier substrate and the adhesive layer.

As shown in FIGS. 4-8, the device wafer 400 and the second chip 200 may be boned together by a low-temperature fusion bonding process through the first oxide layer 450 and the second oxide layer 250.

The fusion bonding is a process of performing bonding mainly by using interface chemistry, in which covalent bonds are formed at contact surfaces between the first oxide layer 450 and the second oxide layer 250; and the bonding may be achieved by covalent bonds. The bonding strength between the first oxide layer 450 and the second oxide layer 250 may be substantially large. Thus, the bonding between the device wafer 400 and the second chip 200 may be increased. Further, the subsequent processes may have substantially less influence on the bonding strength, and the packaging yield of the wafer-level system-in-package may be correspondingly improved. Moreover, because the encapsulation layer 300 may be also exposed in the process environment of the fusion bonding process, the process temperature of the annealing treatment in the fusion bonding process may be reasonably reduced by using the low-temperature fusion bonding process. Thus, the effect of the fusion bonding process on the encapsulation layer 300 may be reduced.

Figure 5:
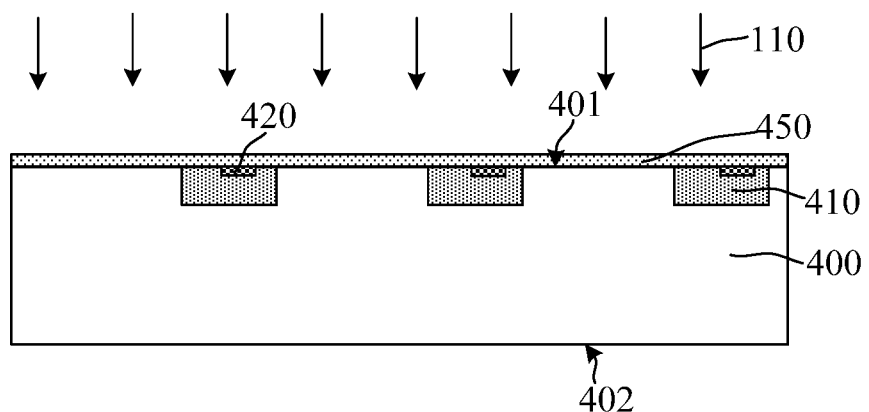
Figure 6:
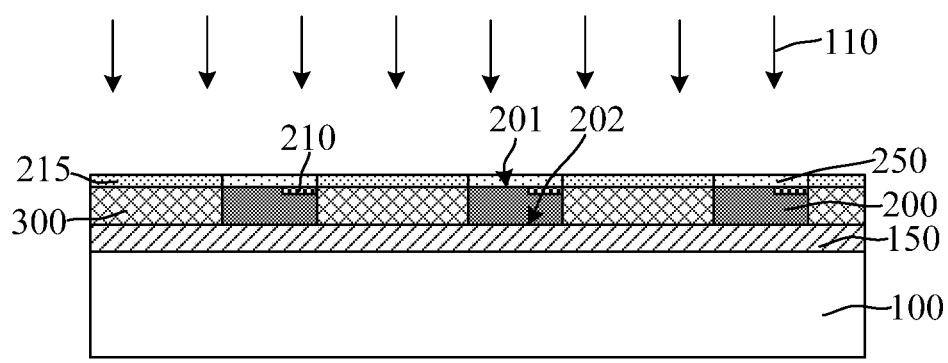

In particular, as shown in FIG. 5 and FIG. 6, the fusion bonding process may include performing a plasma activation treatment 110 on the surface of the first oxide layer 450 (shown in FIG. 5) and the surface of the second oxide layer 250 (as shown in FIG. 6).

On one aspect, by using the plasma activation treatment 110, the pollutants and impurities on the surface of the first oxide layer 450 and the surface of the second oxide layer 250 may be made into a gaseous state, and may be discharged through a vacuum pump of the plasma system. Thus, the pollutants and the impurities may be removed. For example, the metal pollutants and organic pollutants may be effectively removed.

On another aspect, the plasma of the plasma activation process 110 may impact the surface of the first oxide layer 450 and the surface of the second oxide layer 250, and energize the unstable non-bridged oxygen atoms. Thus, the oxygen atoms may left the bonded atoms. The plasma activation treatment 110 may also destroy hydrocarbons on the surface of the first oxide layer 450 and the surface of the second oxide layer 250, and increase the formation of hydroxyl groups (OH) on the surface of the first oxide layer 450 and the surface of second oxide layer 250. Thus, the surface activity of the first oxide layer 450 and the second oxide layer 250 may be increased; and more dangling bonds may be formed on the surface of the first oxide layer 450 and the surface of the second oxide layer 250. Accordingly, a good basis for subsequently forming covalent bonds on the contact faces between the first oxide layer 450 and the second oxide layer 250 may be provided. The more the dangling bonds on the surface of the first oxide layer 450 and the surface of the second oxide layer 250 are, the larger the surface energy is, the more the number of covalent bonds formed subsequently, and the better the effect of the covalent bonding on the contact faces is.

In one embodiment, the material of the first oxide layer 450 and the material of the second oxide layer 250 may be silicon oxide. Thus, after the plasma activation process 110, the first oxide layer 450 and the second oxide layer 250 may be suspended with more silanol (Si—OH) bonds.

The reaction gas used in the plasma activation treatment 110 may include one or more of Ar, $N_2$, $O_2$, and $SF_6$, etc. In one embodiment, the reaction gas used in the plasma activation treatment 110 is $O_2$. In particular, the plasma activation treatment 110 may be an oxygen plasma activation treatment.

The radio frequency power (RF) of the plasma activation treatment 110 should not be too small or too large. During the plasma activation process 110, the radio frequency electric field generated by the radio frequency power source is used to accelerate the electrons, and each electron may collide with the reaction gas molecule to transfer the energy; and each reaction gas molecule may be ionized to generate plasma.

If the RF power is too small, the reaction gas may be difficult to be plasmaized, and the problem of plasma shortage and plasma instability may be easily caused, which is disadvantageous for improving the surface activity of the first oxide layer 450 and the second oxide layer 250. Thus, the dangling bonds on the surfaces of the first oxide layer 450 and the second oxide layer 250 may be decreased, and the number of covalent bonds subsequently formed on the contact faces between the first oxide layer 450 and the second oxide layer 250 may be correspondingly reduced. Further, the bonding strength between the first oxide layer 450 and the second oxide layer 250 may be reduced. If the RF power is too large, the kinetic energy obtained after the reaction gas is plasmaized may be excessively large. Thus, the bombardment effect on the first oxide layer 450 and the second oxide layer 250 may be correspondingly too strong, and it may be easily to cause damages to the surface of the first oxide layer 450 and the surface of the second oxide layer 250. Accordingly, micro-defects may be formed on the surface of the first oxide layer 450 and the surface of the second oxide layer 250. During the subsequent annealing treatment process, annealing voids may be easily generated. Thus, the bonding strength between the first oxide layer 450 and the second oxide layer 250 may be easily reduced. Further, if the RF power is too large, it may consume too much energy, and the process cost may be increased. Thus, in one embodiment, the RF power of the plasma activation process 110 may be in range of approximately 20 W to 200 W.

The process pressure of the plasma activation treatment 110 should not be too small or too large. The process pressure affects the RF power, and the greater the process pressure is, the shorter the mean free path of the plasma is, and the greater the probability of collisions among the plasmas is. Accordingly, the effect of the plasma activation process 110 may be deteriorated. Correspondingly, to ensure the effect of the plasma activation process 110, the required radio frequency power may be higher. When the process pressure is too small, the stability of the plasma may be easily reduced. Correspondingly, the RF power required to suppress the plasma instability may be increased. Thus, in the present embodiment, the process pressure may be adjusted to a matching value range according to the RF power of the plasma activation process 110. In particular, the process pressure may be in a range of approximately 0.1 mbar to 10 mbar.

The processing time of the plasma activation treatment 110 should not be too short or too long. If the processing time is too short, the activation effect on the surfaces of the first oxide layer 450 and the second oxide layer 250 may be correspondingly deteriorated in the case when the RF power and the flow rate of the reaction gas are constant; and the number of covalent bonds subsequently formed on the contact faces between the first oxide layer 450 and the second oxide layer 250 may be correspondingly reduced. Accordingly, the bonding strength between the first oxide layer 450 and the second oxide layer 250 may be reduced. If the processing time is too long, the surface of the first oxide layer 450 and the surface of the second oxide layer 250 may be easily damaged, and micro defects may be formed on the surface of the first oxide layer 450 and the surface of the second oxide layer 250. Further, a substantially long processing time may generate excessive hydroxyl groups, and after a subsequent annealing treatment, excessive by-products (such as $H_2O$ and $H_2$, etc.) may be easily generated, and annealing voids may be generated. Accordingly, the bonding strength between the first oxide layer 450 and the second oxide layer 250 may be reduced. In addition, an excessive process time may also lead to an increase in process cost. Thus, in one embodiment, the processing time of the plasma activation treatment 110 may be in a range of approximately 0.1 minute to 10 minutes.

In one embodiment, by setting the radio frequency power, the process pressure, the flow rate of the reaction gas, and the processing time of the plasma activation treatment 110 within an appropriate range and cooperating with each other, the processing efficiency and stability may be improved, and the process cost may be reduced. At the same time, the activation effect on the first oxide layer 450 and the second oxide layer 250 may be improved.

Figure 7:
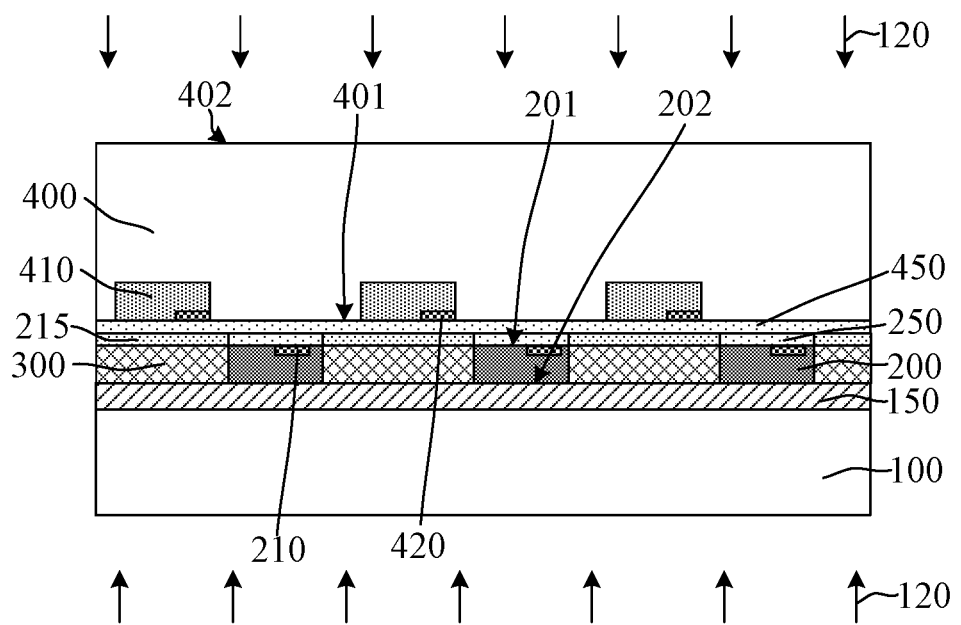

As shown in FIG. 7, in one embodiment, the fusion bonding process may further include aligning and attaching the second oxide layer 250 and the first oxide layer 450 face-to-face after the plasma activation process 110 (as shown in FIG. 5 and FIG. 6) according to a pre-determined relative position relationship between the second chip 200 and the first chip 410. Further, a bonding pressure may be applied to the device wafer 400 and the second chip 200 to perform a pre-bonding treatment 120.

After the plasma activation process 110, the surface of the first oxide layer 450 and the surface of the second oxide layer 250 may have a substantially large amount of dangling bonds. Thus, through the pre-bonding treatment 120, an interface chemical bond connection may be formed between the first oxide layer 450 and the second oxide layer 250.

In one embodiment, after the plasma activation process 110, the surface of the first oxide layer 450 and the surface of the second oxide layer 250 may have more Si—OH bonds. Thus, when the second oxide layer 250 and the first oxide layer 450 are disposed and bonded face-to-face, the contact faces between the first oxide layer 450 and the second oxide layer 250 may be bridged together by the van der Waals force.

In particular, after the second oxide layer 250 and the first oxide layer 450 are disposed and attached face-to-face according to actual process requirements, the second chip 200 may correspond and may be aligned to the first chip 410 one-to-one. The projection of the second chip 200 and the projection of the first chip 410 on the first oxide layer 450 may be offset from each other. Further, a bonding pressure may applied to the first back surface 402 of the device wafer 400 and the surface of the carrier substrate 100 facing away from the second chip 200 to perform the pre-bonding treatment 120.

The manner in which the bonding pressure is applied to the carrier substrate 100 may facilitate to improve the uniformity of the force on the plurality of second chips 200. Further, comparing with the method of directly applying the bonding pressure to the second chip 200, the damage to the second chip 200 caused by the pre-bonding treatment 120 may be reduced.

It should be noted that, increasing the bonding pressure of the pre-bonding treatment 120 may be beneficial to improving the chemical bonding effect and bonding strength of the interface between the first oxide layer 450 and the second oxide layer 250. However, if the bonding pressure is too large, it may be easy to adversely affect the device wafer 400, the first oxide layer 450, the second oxide layer 250, and the second chip 200. For example, deformations may be generated. Therefore, in one embodiment, to effectively achieve the interface chemical bonding between the first oxide layer 450 and the second oxide layer 250 and also reduce the process risk, the bonding pressure of the pre-bonding process 120 may be in range of approximately 1 Newton to 20 Newton.

It should also be noted that, the processing time of the pre-bonding treatment 120 should not be too short or too long. Increasing the processing time of the pre-bonding process 120 may increase the chemical bond connection effect and the bonding strength of the contact faces between the first oxide layer 450 and the second oxide layer 250. Therefore, if the bonding pressure is constant, when the processing time is too short, the problem of the poor chemical bond connection between the first oxide layer 450 and the second oxide layer 250 may be likely to occur. If the processing time is too long, it may cause a waste of time and decrease in efficiency. Therefore, in one embodiment, to effectively achieve the interface chemical bond connection between the first oxide layer 450 and the second oxide layer 250 and increase the process efficiency, the processing time of the pre-bonding treatment 120 may be in a range of approximately 10 seconds to 60 seconds.

Figure 8:
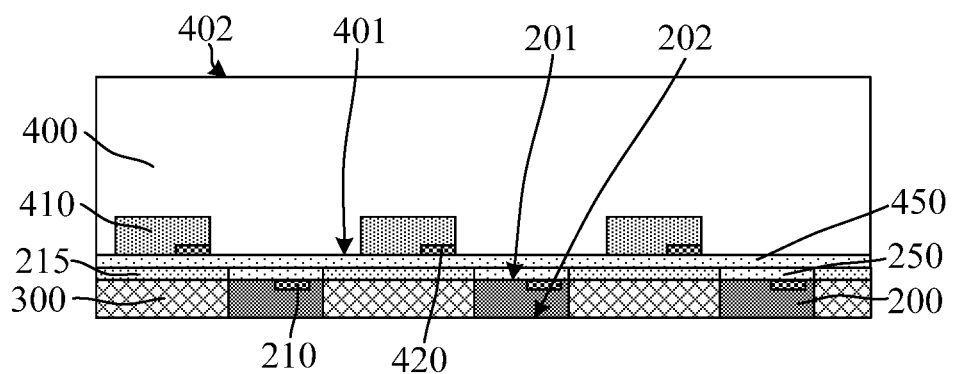

Further, as shown in FIG. 8, in one embodiment, the fusion bonding process may further include annealing the device wafer 400 and the second chip 200 after the pre-bonding treatment 120 (shown in FIG. 7).

By the annealing treatment, a dehydration condensation reaction may occur among the hydroxyl groups on the contact surfaces between the first oxide layer 450 and the second oxide layer 250. Thus, the covalent bonds of Si—O—Si may be formed by the first oxide layer 450 and the second oxide layer 250. Because the bonding energy of the Si—O bonds may be substantially large, the bonding strength between the first oxide layer 450 and the second oxide layer 250 may be increased.

The process temperature of the annealing treatment should not be too low, and should not be too high. If the process temperature is too low, the effect of the dehydration condensation reaction may be easily reduced, the improvement of the bonding strength between the first oxide layer 450 and the second oxide layer 250 may be adversely affected. If the process temperature is too high, it is easy to have an adverse effect on the performance of the devices in the device wafer 400 and the second chip 200. Further, the high temperature resistance of the encapsulation layer 300 may be generally poor. Thus, the high temperature may be easily to affect the encapsulation layer 300. Thus, in one embodiment, the temperature of the annealing treatment may be in a range of approximately 200° C.-500° C.

In one embodiment, the process temperature of the annealing process may be substantially low. Thus, the influence of the annealing process on the performance of the devices formed in the device wafer 400 and the second chip 200, and the encapsulation layer 300 may be reduced.

The process time of the annealing treatment should not be too short, or too long. If the process time is too short, it may be difficult to sufficiently complete the dehydration condensation reaction, the improvement on the bonding strength between the first oxide layer 450 and the second oxide layer 250 may be adversely affected. If the process time is too long, it may cause a waste of process time and process efficiency. Further, if the device wafer 400 and the second chip 200 are placed in the annealing environment for a substantially long time, the process risk may be correspondingly increased. Thus, in one embodiment, the process time of the annealing treatment may be in a range of approximately 20 minutes-200 minutes.

In one embodiment, by setting the process temperature and the process time of the annealing treatment within an appropriate range and cooperating with each other, the bonding strength may be increased while the probability of the occurrence of side effects may be reduced.

It should be noted that, because the second chip 200 and the carrier substrate 100 may be temporarily bonded by the adhesive layer 150 (as shown in FIG. 7), the temperature resistance of the adhesive layer 150 may be substantially poor, at the process temperature of the annealing process, the adhesion of the adhesive layer 150 may be easily reduced, and the possibility of separation between the carrier wafer 100 and the second chip 200 may be substantially high. Thus, the normal progress of the annealing treatment may be adversely affected.

Therefore, in one embodiment, to ensure the process stability and safety, after the pre-bonding treatment 120 and before performing the annealing treatment on the device wafer 400, the second chip 200 and the carrier wafer 100 may be subjected to a de-bonding process to remove the carrier wafer 100 and the adhesive layer 150.

In particular, the de-bonding process may be one or more of a chemical etching process, a mechanical peeling process, a mechanical grinding process, a hot baking process, an ultraviolet light irradiation process, a laser ablation process, a chemical mechanical polishing process, and a wet peeling process, etc. According to the material of the adhesive layer 150, an appropriate process may be selected.

In some embodiments, the second chip and the carrier substrate may be de-bonded after the low-temperature fusion bonding process according to actual process conditions.

It should also be noted that, to increase the bonding strength of the low-temperature fusion bonding process, after the plasma activation process 110 (shown in FIGS. 5-6) and before the pre-bonding treatment 120, a deionized (DI) water cleaning process may be performed on the surface of the first oxide layer 450 and the surface of the second oxide layer 250. After the deionized water cleaning process, the surface of the first oxide layer 450 and the surface of the second oxide layer 250 may be dried.

By performing the deionized water cleaning process and the drying process, the quality of the surface of the first oxide layer 450 and the surface of the second oxide layer 250 may be improved. Accordingly, the bonding strength between the first oxide layer 450 and the second oxide layer 250 may be increased.

In particular, the surface of the first oxide layer 450 and the second oxide layer 250 may be rinsed with deionized water to complete the deionized water cleaning process. After the deionized water cleaning process, $N_2$ may be used to blow dry the first oxide layer 450 and the second oxide layer 250 to complete the drying process.

Figure 4:
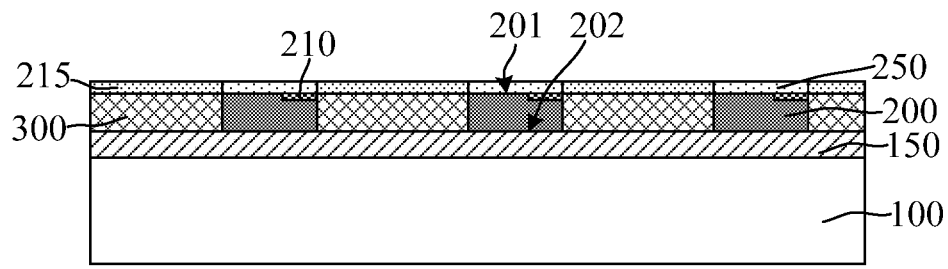

Further, as shown in FIG. 4, after forming the encapsulation layer 300 and before the plasma activation process 110 (shown in FIGS. 5-6), a third oxide layer 215 may be formed on the encapsulation layer 300. The top surface of the third oxide layer 215 may level with the top surface of the second oxide layer 250, and the material of the third oxide layer 215 may be the same as the material of the second oxide layer 250.

The process for forming the encapsulation layer 300 may include a planarization process. After the planarization process, the encapsulation layer 300 may have a problem of poor surface flatness. Such a problem may easily cause gaps to be formed between the encapsulation layer 300 and the first oxide layer 450 (shown in FIG. 7). The formation of the gaps may be effectively reduced by using the third oxide layer 215. The third oxide layer 215 and the first oxide layer 450 may have a substantially good fit. Thus, the performance of the obtained package structure may be enhanced.

Moreover, the material of the third oxide layer 215 may the same as the material of the second oxide layer 250 and the material of the first oxide layer 450, during the low-temperature fusion bonding process, the process compatibility may be improved while the third oxide layer 215 may serve as a part of the bonding layer. In particular, the first oxide layer 450 may also be bonded to the third oxide layer 215 by the covalent bonding. Thus, by using the third oxide layer 215, the bonding strength between the device wafer 400 and the second chip 200 may be further increased, and the packaging yield of the wafer-level system-in-package may be improved.

In one embodiment, the third oxide layer 215 may be formed by an atomic layer deposition process, and the material of the third oxide layer 215 may be silicon oxide. In some embodiments, the third oxide layer may also be made of hafnium oxide, aluminum oxide, or lanthanum oxide, etc. According to the material of the third oxide layer, the process for forming the third oxide layer may also be a low pressure chemical vapor deposition process, a metal-organic chemical vapor deposition process, a physical vapor deposition process, or a pulsed laser deposition process, etc.

The detailed description of the third oxide layer 215 may be referred to the previous description of the first oxide layer 450; and is not described herein again.

Figure 9:
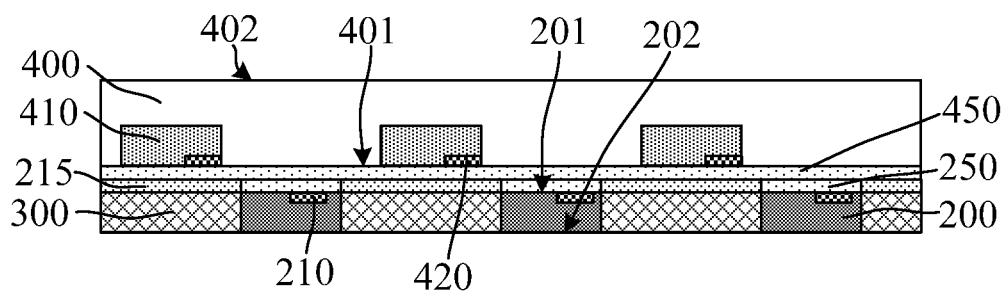

Further, as shown in FIG. 9, it should be noted that, after the fusion bonding process, a thinning process may be performed on the first back surface 402 of the device wafer 400.

By performing the thinning process to the first back surface 402 of the device wafer 400, the thickness of the device wafer 400 may be reduced. Thus, the heat dissipation effect of the device wafer 400 may be improved, the subsequent packaging process may be facilitated, and the overall thickness of the package structure may be reduced. Accordingly, the performance of the package structure may be improved.

In one embodiment, the thinning process may be one or more of a back grinding process, a chemical mechanical polishing (CMP) process, and a wet etching process, etc.

To effectively control the stop position of the thinning process, a deep trench isolation structure for defining the stop position may be often formed in the semiconductor substrate of the device wafer 400 during the fabrication process of the device wafer 400. The thinning process may be stopped at the bottom of the isolation structure.

In some embodiments, a stop region may be formed in the semiconductor substrate of the device wafer 400 by doping certain neutral ions (such as one or more of oxygen ions and nitrogen ions, etc.) during the fabrication process of the device wafer 400. The thinning process may be stopped at the bottom of the stop region. In other embodiments, when the semiconductor substrate of the device wafer is a silicon on insulator (SOI) wafer or a germanium on insulator (GOI) wafer, the bottom substrate layer of the semiconductor substrate may be thinned so as to control the thinning process to stop at the bottom of the insulator layer.

It should be noted that, after the thinning process, the thickness of the device wafer 400 should not be too small, and should not be too large. If the thickness of the device wafer 400 is too small, the mechanical properties of the device wafer 400 may be correspondingly reduced, and it may be easy to adversely affect the structure of devices, etc. formed in the device wafer 400. If the thickness of the wafer 400 is too large, it may be disadvantageous to improve the performance of the formed package structure. Thus, in one embodiment, after the thinning process, the thickness of the device wafer 400 may be in a range of approximately 5 μm to 10 μm.

Figure 10:
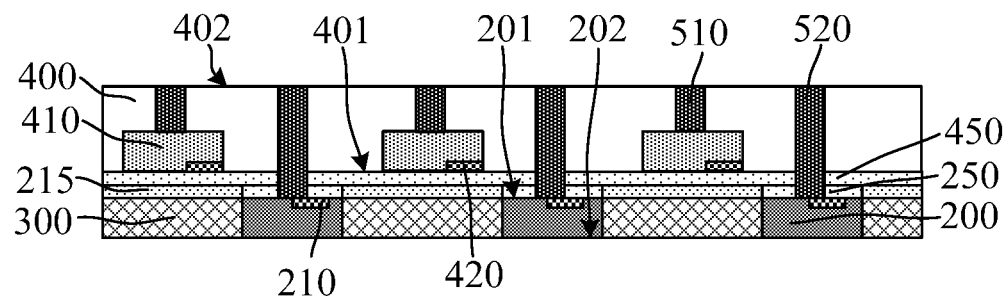

Further, as shown in FIG. 10, after the thinning process, a first via structure 510 electrically connected to the first chip 410 and a second via structure 520 electrically connected to the second chip 200 may be formed in the device wafer 400.

The first via structure 510 and the second via structure 520 may be used to electrically connect the first chip 410 and the second chip 200 to other circuits, and form electrical connections between the first chip 410 and the second chip 200.

In one embodiment, the first via structure 510 and the second via structure 520 may be through-silicon via structures. In particular, the first via structure 510 and the second via structure 520 may be formed by through-silicon via (TSV) etching process and an electroplating process. In particular, the first via structure 510 may be electrically connected to the metal interconnect structure in the first chip 410, and the second via structure 520 may have an electrical connection with the second soldering pad 210 in the second chip 200.

In one embodiment, the material of the first via structure 510 and the second via structure 520 may be copper. In some embodiments, the materials of the first via structure and the second via structure may also be other conductive materials such as aluminum, tungsten, or titanium, etc.

Accordingly, the present disclosure also provides a wafer level package structure. FIG. 10 illustrates a block diagram of an exemplary wafer level package structure consistent with various disclosed embodiments.

As shown in FIG. 10, the wafer level package structure may include a device wafer 400 integrated with at least one first chip 410. The device wafer 400 may have a first front surface 401 integrated with the first chip 410 and a first back surface 402 opposing the first front surface 401. The first front surface 401 may have a first oxide layer 450. The wafer level package structure may also include a second chip 200 bonded to the device wafer 400. The second chip 200 may have a to-be-bonded surface (not labeled), and the to-be-bonded surface may have a second oxide layer 250. The second oxide layer 250 may be bonded with the first oxide layer 450 by a low-temperature fusion bonding process. Further, the wafer level package structure may include an encapsulation layer 300 on the first oxide layer 450. The encapsulation layer 300 may expose a surface of the second chip 210 facing away from the to-be-bonded surface.

In one embodiment, the wafer level package structure is a wafer-level system-in-package structure. Thus, the area of the package structure may be significantly reduced, the manufacturing cost may be reduced, the electrical performance may be optimized, and the batch manufacturing may be realized. Accordingly, the workload and equipment needs may be lowered.

The device wafer 400 may be a finished product. The device wafer 400 may include devices, such as NMOS devices and PMOS devices, etc., on a semiconductor substrate. The device wafer 400 may also include other structures, such as dielectric layers on the devices, metal interconnect structures, and soldering pads electrically connected to the metal interconnect structures, etc. Therefore, at least one first chip 410 may be integrated in the device wafer 400, and a first soldering pad 420 may be formed in the first chip 410.

In one embodiment, the device wafer 400 may include a first front surface 401 integrated with the first chip 410 and a first back surface 402 opposing the first front surface 401. The first front surface 401 may expose the first soldering pad 420. The first back surface 402 may refer to as a bottom surface of the semiconductor substrate of the device wafer 400 away from the side having the first soldering pad 420.

In one embodiment, the thickness of the device wafer 400 may be in a range of approximately 5 µm to 10 µm. The thickness of the device wafer 400 may be substantially small such that the heat dissipation effect of the device wafer 400 may be improved. Further, it may facilitate the packaging process, and reduce the overall thickness of the package structure. Accordingly, the performance of the package structure may be improved.

The detailed description of the device wafer 400 may be referred to the description of the previous embodiments; and is not described herein again.

The number of the second chips 200 may be at least one, and the number of the second chips 200 may be the same as the number of the first chips 410. The second chip 200 may be one or more of an active device, a passive device, an MEMS, and an optical device, etc. In particular, the second chip 200 may be a memory chip, a communication chip, a processing chip, a flash memory chip, or a logic chip, etc. In some embodiments, the second chip may also be other functional chips.

In one embodiment, the number of the second chips 200 may be greater than one, and the plurality of second chips 200 may be obtained by dicing a plurality of wafers of different functional types. In some embodiments, the functional types of the plurality of second chips may be the same according to actual process requirements.

In one embodiment, the second chip 200 may correspond to the corresponding first chip 410 one-on-one according to actual process requirements. The projection of the second chip 200 on the first oxide layer 450 and the projection of the first chip 410 on the first oxide layer 450 may be staggered from each other.

The second chip 200 may be fabricated by using an integrated circuit fabrication technique. The second chip 200 may also generally include devices, such as NMOS devices and/or PMOS devices, formed on a semiconductor substrate. The second chip may also include other structures, such as dielectric layers on the devices, metal interconnect structures, and/or soldering pads, etc.

In particular, the second chip 200 may include a second front surface 201 formed with a second soldering pad 210 and a second back surface 202 opposing the second back surface 201. The second front surface 201 may expose the second soldering pad 210. The second back surface 202 may refer to as a bottom surface of the semiconductor substrate of the second chip 200 away from the side having the second soldering pad 210.

In one embodiment, the to-be-bonded surface of the second chip 200 may be the second front surface 201. In particular, the second front surface 201 may face the device wafer 400. Correspondingly, during the fabrication process of the package structure, the process difficulty of for forming a via structure (for example, the through-silicon via structure) may be reduced; and the process cost may be reduced. Further, the thickness of the via structure may also be correspondingly reduced. In some embodiments, the to-be-bonded surface may also be the second back surface. In particular, the second back surface may face the device wafer according to actual process requirements.

The detailed description of the second chip 200 may be referred to the corresponding description in the previous embodiments, and is not described herein again.

The second oxide layer 250 may be bonded with the first oxide layer 450 by a low-temperature fusion bonding process for realizing a physical connection between the device wafer 400 and the second chip 200.

The fusion bonding process is a process for performing bonding mainly by using interface chemistry. Thus, the first oxide layer 450 and the second oxide layer 250 may have a substantially high bonding strength; and the yield of the package structure may be improved.

Moreover, in the fabrication process of the package structure, a via etching process may be used, and the via etching process may include sequentially etching the device wafer 400 and the second oxide layer 250. Because the second oxide layer 250 may be an inorganic material layer, and the material of the device wafer 400 may be an inorganic material, comparing with a scheme in which an organic adhesive layer (for example, an adhesive film) is used as a bonding layer, the disclosed method that the second oxide layer 250 is used as a bonding layer may reduce the process difficulty. Further, after the via etching process, the issue that the through hole in the second oxide layer 250 is etched too large may be avoided. Thus, the electrical connection performance of the via structure may be improved.

In addition, the fusion bonding process may often include an annealing treatment process. The second oxide layer 250 and the first oxide layer 450 may be bonded together by a low-temperature fusion bonding process. In particular, the annealing treatment may have a substantially low process temperature. Thus, the influence of the annealing treatment on the performance of the devices formed in the device wafer 400 and the second chip 200 may be reduced.

In one embodiment, the material of the second oxide layer 250 may be the same as the material of the first oxide layer 450 such that a covalent bonding may be better achieved. Further, the bonding strength between the second oxide layer 250 and the first oxide layer 450 may be further increased.

In particular, the material of the first oxide layer 450 may be silicon oxide, and the material of the second oxide layer 250 may be silicon oxide. Correspondingly, the first oxide layer 450 and the second oxide layer 250 may be bonded by covalent bonds of Si—O—Si, Thus, the bonding strength between the first oxide layer 450 and the second oxide layer 250 may be effectively improved due to the large bond energy of the Si—O bonds. Moreover, silicon oxide may have a substantially high process compatibility, and is a commonly used and low cost material, using silicon oxide may reduce the process cost and process difficulty. Further, the influence on the performance of the formed package structure may be reduced. In some embodiments, the first oxide layer may also be made of hafnium oxide, aluminum oxide, or lanthanum oxide, etc., and the second oxide layer may also be made of hafnium oxide, aluminum oxide, or lanthanum oxide, etc.

In one embodiment, to reduce the process difficulty, the first oxide layer 450 and the second oxide layer 250 may have a same thickness. However, the thickness of the first oxide layer 450 and the second oxide layer 250 should not be too small, or too large. If the thickness is too small, the thickness uniformity and the quality of the first oxide layer 450 and the second oxide layer 250 may be easily reduced. If the thickness is too large, the overall thickness of the package structure may be excessively large. Thus, it may be adversely affect the improvement of the process integration, and may also increases the difficulty of the via etching process and the thickness of the via structure during the fabrication process of the package structure. Thus, in one embodiment, the thickness of the first oxide layer 450 may be in a range of approximately 1000 Å-30000 Å, and the thickness of the second oxide layer 250 may be in a range of approximately 1000 Å-30000 Å.

In one embodiment, during the formation of the package structure, after forming the encapsulation layer 300 covering the second chip 200, the first oxide layer 450 may be bonded with the second oxide layer 250. Therefore, the encapsulation layer 300 may also support the second chip 200 during the low-temperature fusion bonding process. Accordingly, the process operability of the low-temperature fusion bonding process may be improved.

It can be seen from the previous analysis that the process temperature of the annealing treatment in the low-temperature fusion bonding process may be substantially low. Thus, the low-temperature fusion bonding process may have less influence on the encapsulation layer 300, and the quality and the performance of the encapsulation layer 300 may be ensured. In particular, to ensure the bonding effect between the second oxide layer 250 and the first oxide layer 450 and to reduce the occurrence of side effects, the temperature of the annealing treatment may be in a range of approximately 200° C. to 500° C.

The encapsulation layer 300 may cover the second chip 200 and may function as a sealing and moisture proof layer to protect the second chip 200. Thus, the probability that the second chip 200 is damaged, contaminated, or oxidized may be reduced. Accordingly, the performance of the obtained package structure may be optimized.

In one embodiment, the material of the encapsulation layer 300 is epoxy resin. Epoxy resin may have the advantages of low shrinkage, good adhesion, good corrosion resistance, excellent electrical properties, and low cost, etc., so it is widely used as a packaging material for electronic devices and integrated circuits. In some embodiments, the material of the encapsulation layer may also be a thermosetting material, such as polyimide, or silicon, etc.

In one embodiment, the shape of the encapsulation layer 300 is a wafer shape, and the diameter of the wafer shape encapsulation layer 300 may be the same as the diameter of the device wafer 400. In some embodiments, the encapsulation layer may also be in other appropriate shape.

It should be noted that, during the process for forming the encapsulation layer 300, the second chip 210 may be often attached to a carrier substrate with a temporary bonding manner, and the encapsulation layer 300 may be formed on the carrier substrate. To form a bonding between the first oxide layer 450 and the second oxide layer 250, the process for forming the encapsulation layer 300 may often include a planarization process to enable the encapsulation layer 300 to expose the to-be-bonded surface of the second chip 210. However, after the planarization process, the encapsulation layer 300 may be prone to the problem of poor surface flatness, and gaps may be formed between the encapsulation layer 300 and the first oxide layer 450.

Thus, in one embodiment, the package structure may further include a third oxide layer 215 between the encapsulation layer 300 and the first oxide layer 450. The material of the third oxide layer 215 may be the same as the material of the second oxide layer 250.

By using the third oxide layer 215, the formation of the gaps may be significantly reduced, and the third oxide layer 215 and the first oxide layer 450 may have a good fit. Thus, the performance of the obtained package structure may be improved. The material of the third oxide layer 215 may be the same as the material of the second oxide layer 250 and the first oxide layer 450, and the third oxide layer 215 may also function as a bonding layer while improving process compatibility. In particular, the first oxide layer 450 may also be bonded to the third oxide layer 215 by the covalent bonding. Thus, by using the third oxide layer 215, the bonding strength between the device wafer 400 and the second chip 200 may be further improved; and the packaging yield of the wafer-level system-in-package may be further increased.

In one embodiment, the material of the third oxide layer 215 is silicon oxide. In some embodiments, the third oxide layer may also be made of hafnium oxide, aluminum oxide, or lanthanum oxide, etc.

In addition, in one embodiment, the package structure may further include a first via structure 510 formed in the device wafer 400 and electrically connected to the first chip 410; and a second via structure 520 located at the device wafer 400 and electrically connected to the second chip 200.

The first via structure 510 and the second via structure 520 may be used to implement electrical connections among the first chip 410 and the second chip 200 and other circuits, and the electrical connection between the first chip 410 and the second chip 200. In particular, the first via structure 510 may be electrically connected to the metal interconnect structure in the first chip 410, and the second via structure 520 may be electrically connected to the second pad 210 in the second chip 200.

In one embodiment, the first via structure 510 and the second via structure 520 may be through-silicon via structures. In particular, the first via structure 510 and the second via structure 520 may be formed by a through-silicon via etching process and an electroplating process. In particular, the material of the first via structure 510 and the second via structure 520 may be copper. In some embodiments, the materials of the first via structure and the second via structure may also be conductive materials, such as aluminum, tungsten, and titanium, etc.

The package structure described in the exemplary embodiment may be formed by using the wafer level packaging method described in the previous embodiments, or may be formed by other packaging methods. A detailed description of the wafer level package structure in the disclosed embodiment may refer to the corresponding description in the previous embodiments, and details are not described herein again.

As disclosed, the technical solutions of the present disclosure may have the following advantages.

In the present disclosure, a first oxide layer may be formed on the first front surface of the device wafer, and a second oxide layer may be formed on the to-be-bonded surface of the to-be-integrated second chip. After subsequently forming the encapsulation layer, the device wafer and the second chip may be bonded together through the first oxide layer and the second oxide layer by a low-temperature fusion bonding process. On one hand, the encapsulation layer may support the second chip in the subsequent low-temperature fusion bonding process, and the operability of the low-temperature fusion bonding process may be improved. On the other hand, during the low-temperature fusion bonding process, the surface activity of the first oxide layer and the second oxide layer may be increased, and the dangling bonds on the surfaces of the first oxide layer and the second oxide layer may be increased. Thus, covalent bonds may be formed on the contact surfaces of the first oxide layer and the second oxide layer and the bonding may be achieved in a manner of covalent bonds. Further, the bonding strength between the first oxide layer and the second oxide layer may be substantially strong. Thus, the bonding strength between the device wafer and the second chip may be increased, and the packaging yield may be correspondingly improved.

In an optional embodiment, after forming the encapsulation layer and before the low-temperature fusion bonding process, a third oxide layer may be formed on the encapsulation layer. The top of the third oxide layer may level with the top of the second oxide layer. On one hand, when the surface flatness of the encapsulation layer is substantially poor, gaps may be easily formed between the encapsulation layer and the first oxide layer. By forming the third oxide layer, the generation of the gaps may be effectively reduced, and the third oxide layer and the first oxide layer may have a substantially high degree of adhesion. On the other hand, during the low-temperature fusion bonding process, the first oxide layer may also be bonded with the third oxide layer by covalent bonds. Thus, the third oxide layer may facilitate to further improve the packaging yield.

Although the present disclosure has been disclosed above, the present disclosure is not limited thereto. Any changes and modifications may be made by those skilled in the art without departing from the spirit and scope of the disclosure, and the scope of the disclosure should be determined by the scope of the claims.

What is claimed is:

1. A wafer level packaging method, comprising:
providing a device wafer having a first front surface and a first back surface opposing the first front surface, wherein at least one first chip is integrated on the first front surface of the device wafer;
forming a first oxide layer on the first front surface of the device wafer;
providing at least one second chip having a to-be-bonded surface;
forming a second oxide layer on the to-be-bonded surface of each second chip;
providing a carrier wafer;
temporally bonding a surface of the second chip opposing the second oxide layer to the carrier wafer;
forming an encapsulation layer on the carrier wafer between adjacent second chips of the at least one second chip, the encapsulation layer exposing a top of the second oxide layer; and
bonding the device wafer and the second chip by bonding the first oxide layer and the second oxide layer using a low-temperature fusion bonding process.

2. The method according to claim 1, wherein the low-temperature fusion bonding process comprises:
sequentially performing a plasma activation process, a deionized water cleaning process and a drying process on a surface of the first oxide layer and a surface of the second oxide layer;
after the drying process, correspondingly aligning and attaching the first oxide layer with the second oxide layer, according to a preset relative position relationship between the first chip and the second chip, and applying a pressure to the device wafer and the second chip to perform a pre-bonding treatment; and
after the pre-bonding treatment, performing an annealing treatment on the device wafer and the second chip.

3. The method according to claim 1, after forming the encapsulation layer and before performing the low-temperature fusion bonding process, further comprising:
forming a third oxide layer on the encapsulation layer, wherein:
a top of the third oxide layer levels with a top of the second oxide layer; and
the third oxide layer and the second oxide layer are made of a same material.

4. The method according to claim 1, after forming the encapsulation layer and before the low-temperature fusion bonding process, further comprising:
de-bonding the second chip from the carrier wafer.

5. The method according to claim 2, after the pre-bonding treatment and before the annealing treatment, further comprising:
de-bonding the second chip from the carrier wafer.

6. The method according to claim 1, after the low-temperature fusion process, further comprising:
de-bonding the second chip from the carrier wafer.

7. The method according to claim 1, after the low-temperature fusion bonding process, further comprising:
thinning the first back surface of the device wafer.

8. The method according to claim 1, wherein:
the first oxide layer is made of one of silicon oxide, hafnium oxide, aluminum oxide, and lanthanum oxide;
the second oxide layer is made of one of silicon oxide, hafnium oxide, aluminum oxide, and lanthanum oxide; and
the first oxide layer and the second oxide layer are made of a same material.

9. The method according to claim 2, wherein:
a reaction gas of the plasma activation process includes at least one of Ar, $N_2$, $O_2$, and $SF_6$.

10. The method according to claim 2, wherein:
a radio frequency power of the plasma activation process is in a range of approximately 20 W-200 W;
a process pressure of the plasma activation process is in a range of approximately 0.1 mbar-10 mbar; and
a process time of the plasma activation process is in a range of approximately 0.1 minute-10 minutes.

11. The method according to claim 2, wherein:
a bonding pressure of the pre-bonding treatment process is in a range of approximately 1 Newton-20 Newton; and
a process time of the pre-bonding treatment process is in a range approximately 1 second-60 seconds.

12. The method according to claim 2, wherein:
a process temperature of the annealing treatment is in a range of approximately 200° C.-500° C.; and
a process time of the annealing treatment is in a range of approximately 20 minutes-200 minutes.

13. The method according to claim 1, wherein:
any of the first oxide layer and the second oxide layer are formed by one of an atomic layer deposition process, a low-pressure chemical vapor deposition process, a metal-organic chemical vapor deposition process, a physical vapor deposition process and a pulsed laser deposition process.

14. The method according to claim 1, wherein:
the second chip has a second front surface formed with at a least one soldering pad and a second back surface opposing the second front surface; and one of the second front surface and the second back surface is used for the bonding.

15. A wafer level package structure, comprising:
a device wafer having a first front surface and a first back surface opposing the front surface, wherein at least one first chip is integrated in the first front surface and a first oxide layer is formed on the first front surface;
a second chip bonded with the device wafer, wherein the second chip has a to-be-bonded surface, a second oxide layer is formed on the to-be-bonded surface, and the second oxide layer and the first oxide layer are bonded together, wherein orthographic projections of the first and second chips on a plane of an interface between the first and second oxide layers are non-overlapped; and
an encapsulation layer formed on the first oxide layer, the encapsulation layer exposing a surface of the second chip opposing the to-be-bonded surface.

16. The wafer level package structure according to claim 15, further comprising:
a third oxide layer formed between the encapsulation layer and the first oxide layer and made of a material the same as a material of the first oxide layer.

17. The wafer level package structure according to claim 15, wherein:
a thickness of the first oxide layer is in a range of approximately 1000 Å-30000 Å; and
a thickness of the second oxide layer is in a range of approximately 1000 Å-30000 Å.

18. The wafer level package structure according to claim 15, wherein:
the first oxide layer is made of one of silicon oxide, hafnium oxide, aluminum oxide and lanthanum oxide;
the second oxide layer is made of one of silicon oxide, hafnium oxide, aluminum oxide and lanthanum oxide; and
the first oxide layer and the second oxide layer are made of a same material.

19. The wafer level package structure according to claim 15, wherein:
the second chip comprises:
a second front surface that is formed with at least one soldering pad; and
a second back surface opposing the second front surface,
wherein the to-be-bonded surface is one of the second front surface containing the at least one soldering pad and the second back surface.

20. The wafer level package structure according to claim 15, further comprising:
at least a first via structure formed in the device wafer and electrically connected to the first chip; and
at least a second via structure formed in the device wafer and electrically connected to the second chip.

* * * * *